United States Patent
Winkelmann

(10) Patent No.: US 12,416,658 B2
(45) Date of Patent: Sep. 16, 2025

(54) STATE ANALYSIS OF AN ELECTRICAL OPERATING RESOURCE

(71) Applicant: Maschinenfabrik Reinhausen GmbH, Regensburg (DE)

(72) Inventor: Erik Winkelmann, Dresden (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 489 days.

(21) Appl. No.: 17/287,118

(22) PCT Filed: Oct. 24, 2019

(86) PCT No.: PCT/EP2019/079037
§ 371 (c)(1),
(2) Date: Apr. 21, 2021

(87) PCT Pub. No.: WO2020/084058
PCT Pub. Date: Apr. 30, 2020

(65) Prior Publication Data
US 2021/0356507 A1  Nov. 18, 2021

(30) Foreign Application Priority Data
Oct. 26, 2018 (DE) ...................... 10 2018 126 743.6

(51) Int. Cl.
*G01R 31/08* (2020.01)
*G01R 31/11* (2006.01)
(Continued)

(52) U.S. Cl.
CPC ............ *G01R 31/083* (2013.01); *G01R 31/11* (2013.01); *G01R 31/1272* (2013.01); *G01R 31/14* (2013.01)

(58) Field of Classification Search
CPC ...... G01R 31/08; G01R 31/083; G01R 31/11; G01R 31/12; G01R 31/1272; G01R 31/14;
(Continued)

(56) References Cited

U.S. PATENT DOCUMENTS 4,887,041 A  12/1989 Mashikian et al.
5,272,439 A  12/1993 Bansal et al.
(Continued)

FOREIGN PATENT DOCUMENTS

CN  102565634 A  7/2012
CN  106160944 A  11/2016
(Continued)

OTHER PUBLICATIONS

Lecture 6: Linear Prediction LPC by "Dan Ellis", "ECE 401: Signal and Image Analysis, Feb. 5, 2013" (Year: 2013).*

*Primary Examiner* — Son T Le
(74) *Attorney, Agent, or Firm* — LEYDIG, VOIT & MAYER, LTD.

(57) ABSTRACT

A method analyzes the state of an electrical operating resource. The method includes: applying a test voltage to the operating resource; acquiring a measurement signal at a connection point of the operating resource; ascertaining transfer parameters that characterize a signal transmission from a location of a partial discharge in the operating resource to the connection point depending on the measurement signal; and determining at least one characteristic variable of the partial discharge depending on the transfer parameters.

13 Claims, 3 Drawing Sheets

(51) Int. Cl.
  *G01R 31/12*   (2020.01)
  *G01R 31/14*   (2006.01)
(58) Field of Classification Search
  CPC .. G01R 29/0878; G01R 31/086; H01B 11/06;
       H01B 11/02; H01B 7/0876; H04B 7/02
  See application file for complete search history.

(56) References Cited

U.S. PATENT DOCUMENTS

| | | |
|---|---|---|
| 6,420,879 B2 | 7/2002 | Cooke |
| 6,448,782 B1 | 9/2002 | Bjorkqvist et al. |
| 10,197,615 B2 | 2/2019 | Di Stefano et al. |
| 2011/0125701 A1 | 5/2011 | Nair et al. |
| 2013/0006560 A1 | 1/2013 | Cern |
| 2014/0043035 A1 | 2/2014 | Klapper et al. |
| 2015/0316599 A1 | 11/2015 | Weindl et al. |
| 2016/0282402 A1* | 9/2016 | Markalous ............ G01R 31/088 |
| 2020/0166561 A1 | 5/2020 | Winkelmann |

FOREIGN PATENT DOCUMENTS

| | | |
|---|---|---|
| CN | 107656226 A | 2/2018 |
| DE | 10005540 A1 | 8/2001 |
| DE | 60020050 T2 | 1/2006 |
| DE | 69333936 T2 | 6/2006 |
| DE | 102017116613 B3 | 8/2018 |
| JP | 2015143701 A | 8/2015 |
| KR | 101574615 B1 | 12/2015 |
| RU | 2365928 C1 | 8/2009 |
| RU | 2536795 C1 | 12/2014 |
| SU | 1758601 A1 | 8/1992 |

\* cited by examiner

STATE ANALYSIS OF AN ELECTRICAL OPERATING RESOURCE

CROSS-REFERENCE TO PRIOR APPLICATIONS

This application is a U.S. National Phase Application under 35 U.S.C. § 371 of International Application No. PCT/EP2019/079037, filed on Oct. 24, 2019, and claims benefit to German Patent Application No. DE 102018126743.6, filed on Oct. 26, 2018. The International Application was published in German on Apr. 30, 2020, as WO 2020/084058 A1 under PCT Article 21(2).

FIELD

The present invention relates to a method for analyzing the state of an electrical operating resource and a test apparatus for analyzing the state of an electrical operating resource.

BACKGROUND

A locally restricted electrical discharge is referred to as a partial discharge, PD, that only partially bridges an insulation between conductors, and which can occur adjacent to a conductor, but does not have to. Partial discharges can be traced back to fault sources, for example to fault locations or inhomogeneities in the electrical insulation. Partial discharges contribute to aging of the electrical insulation, and therefore have a disadvantageous effect on the dielectric quality, in particular on the dielectric strength, thereof. In order to ensure the dielectric quality of electrical operating resources, partial discharge measurements are carried out in order to check for the presence of partial discharges and, in relevant cases, to determine their specific properties.

A signal that is generated by a PD as a response to a test voltage naturally passes through a certain transmission path between the location of the PD and the measuring location. Depending on the distribution of the inductive, capacitive, and resistive elements of the operating resource (cable, transformer etc.) the original PD pulse is attenuated and deformed. As a rule, only a fraction of the discharge energy released at the fault site can be measured at the measuring point. What is known as apparent charge is therefore spoken of. Only low sensitivity is therefore achieved with known measurement methods. The greater the distance between the site of the PD and the measuring location, the greater is the error in the determination of the apparent charge. PD values that must not be exceeded are usually defined for the quality assurance and monitoring of operating resources. This definition relates to the apparent charge that can be measured at the measuring point which, in turn, is only a fraction of the actual discharge energy. Only limited quality assurance of the operating resource is therefore possible.

The method of time-domain reflectometry can be used in order to be able to locate a possible fault in the operating resource. The time difference between the injected test pulse and the measured reflection corresponds here to twice the distance to the fault location. In terms of the measurement, this is made significantly more difficult through signal attenuation and dispersion, since the localization is only possible with sufficient signal amplitude according to this method. The method, moreover, assumes that reflection occurs at the fault location, which, as a result of the wave impedance at the fault location, is not always the case. When certain types of operating resource, gas isolated switchgear, GIS, or gas-insulated cables, GIL, for example, are used in the grid, fault localization in the manner described above is often not possible, since a large number of discharges mask the reflections that might be present, or the amplitude of the discharge that is to be localized is too small to still be measured after the reflection.

SUMMARY

In an embodiment, the present invention provides a method that analyzes the state of an electrical operating resource. The method includes: applying a test voltage to the operating resource; acquiring a measurement signal at a connection point of the operating resource; ascertaining transfer parameters that characterize a signal transmission from a location of a partial discharge in the operating resource to the connection point depending on the measurement signal; and determining at least one characteristic variable of the partial discharge depending on the transfer parameters.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
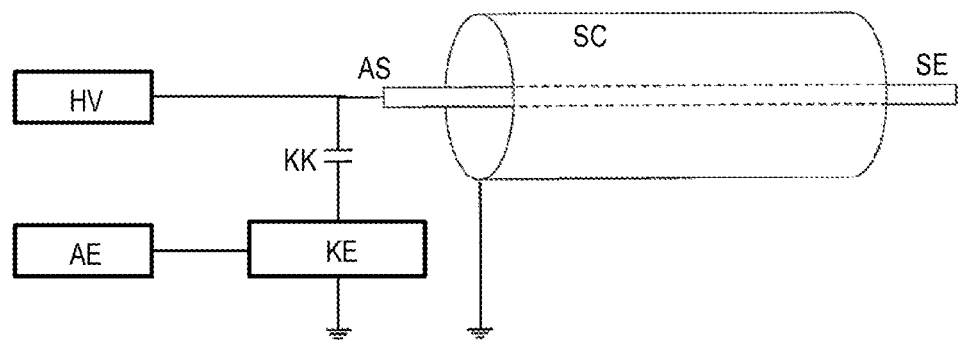
FIG. 1 shows a schematic illustration of an exemplary form of embodiment of a test apparatus according to the improved concept, and an exemplary operating resource.

The present invention provides an improved concept for the PD measurement of an electrical operating resource that enables a greater precision of the PD analysis.

The improved concept is based on the idea of identifying the influence of the transmission path on the signal from a measurement signal that is, in particular, acquired in response to an applied test voltage. This influence is described by transfer parameters that are characteristic of the partial discharge or of the fault source or fault sources. The transfer parameters therefore permit conclusions to be drawn regarding characteristic variables of the partial discharge.

According to the improved concept, a method for analyzing the state of an electrical operating resource is provided. According to the method, a test voltage is applied to the operating resource, for example injected into the operating resource, in particular at an injection point of the operating resource. A measurement signal is thereupon acquired at a connection point of the operating resource. Depending on the measurement signal, transfer parameters that characterize a signal transmission from a location of a partial discharge in the operating resource to the connection point are ascertained. At least one characteristic variable of the partial discharge is determined depending on the transfer parameters.

The measurement signal can be understood as a response from the partial discharge to the test voltage. Multiple partial discharges, for example at different locations of the operating resource, can also lead together to the measurement signal as a response to the test voltage. This is included in the formulation "location of the partial discharge" and, where appropriate, is to be understood as "locations of the partial discharges" or corresponding expressions.

According to at least one form of embodiment of the method, the ascertainment of the transfer parameters includes a discretization and/or digitization of the measurement signal, whereby a discrete measurement signal is generated.

According to at least one form of embodiment of the method, the transfer parameters represent the parameters of a transfer function that characterize the signal transmission from the location of a partial discharge to the connection point. The measurement signal, or the discrete measurement signal, can here be understood as an image of an input signal at the location of the partial discharge or, in the case of multiple partial discharges, at an apparent partial discharge location, wherein the transfer function functions as an imaging operator. The transfer function can always, here and in what follows, also represent an approximation to an exact transfer function.

The test voltage is in particular an alternating voltage, for example with a frequency in the range of 0-500 Hz. DC voltage can however alternatively be used as the test voltage in different forms of embodiment. The test voltage is in particular provided by a high-voltage source that is connected directly or indirectly, and in particular via at least one blocking impedance and/or an input filter, to the injection point. The blocking impedance and/or the input filter can have the purpose of decoupling the high-voltage source from the rest of the test setup.

According to at least one form of embodiment, the transfer parameters are ascertained by means of a method for linear predictive coding, LPC, or parts of a method for LPC. LPC methods are at present used in the processing of audio signals and speech. A signal value is determined here at a particular point in time from a linear combination of signal values from previous, discrete points in time, and thus to an extent predicted.

According to at least one form of embodiment, the ascertainment of the transfer parameters, in particular the method for LPC, includes the ascertainment of filter coefficients of a virtual filter, wherein the filter approximately simulates the signal transmission.

The filter is described here as virtual since it does not have a physical embodiment in the sense of a dedicated filter component, but is effectively formed through the operating resource, the measurement circuit and, where relevant, the fault source or fault sources.

In accordance with LPC, the filter is, for example, described by a recursive equation, for example as follows:

$$y(k)=e(k)+\Sigma_{i=1}^{N}a_i y(k-i). \quad (1)$$

Here, k is a discrete time variable, i.e. a natural number greater than zero, y(k) is the value of the discrete measurement signal at the discrete time point k, and N is an order of the approximation. Here, y(k-i) is defined as equal to 0 if (k-i) is lower than or equal to zero. The $a_k$ here are what are known as the linear predictors of the Nth order, and e(k) is a prediction error.

According to at least one form of embodiment, the predictors $a_k$ represent the transfer parameters.

Since the values of the discrete measurement signal are known, the transfer parameters can be determined in that the total square error is minimized. The total square error is given by qE according to the equation:

$$qE=\Sigma_{k=1}^{N}e^2(k)=\Sigma_{k=1}^{N}(y(k)-\Sigma_{i=1}^{N}a_i y(k-i))^2 \quad (2)$$

The total square error of the $a_i$ can be differentiated for this purpose, the result equated to zero, and the resulting equation system comprising N linear equations solved.

According to at least one form of embodiment, the operating resource is homogeneously constructed, and in particular resistor elements, inductive, and/or capacitive elements of the operating resource are distributed homogeneously. The homogeneously constructed operating resource can, for example, be a cable, in particular a screened cable, for example a screened high-voltage cable, a GIS or a GIL.

According to at least one form of embodiment, the operating resource is inhomogeneously constructed, and in particular resistor elements, inductive, and/or capacitive elements of the operating resource are distributed inhomogeneously. The inhomogeneously constructed operating resource can, for example, be a power transformer, a tap changer or another component of a power transformer. The inhomogeneously constructed operating resource can also be a power switch, an isolator, an isolating switch for use in a GIS or air-insulated switchgear, a measurement transducer, or a surge arrester.

According to at least one form of embodiment, the at least one characteristic variable contains one or a plurality of fault sources from which the partial discharge results. This can be advantageous for both homogeneously constructed and for inhomogeneously constructed operating resources.

Such a form of embodiment can in particular be advantageous in DC applications or in applications for the continuous monitoring of operating resources.

According to at least one form of embodiment, the at least one characteristic variable of one or a plurality of fault sources contains a number of the fault sources or a relative contribution of one of the fault sources to the partial discharge, in particular to a total charge value of the division charge.

According to at least one form of embodiment, the at least one characteristic variable of the fault sources is used to identify a fault pattern.

Such an identification is not possible with known methods for PD measurement. The improved concept thus permits an evaluation of the partial discharge. Depending on the evaluation, a decision can, for example, be taken as to whether an action such as, for example, servicing, repair, removal from service or an exchange of the operating resource or a part thereof is necessary. Unnecessary actions in particular can be avoided.

The identification can in particular be made through the distribution of the transfer parameters. The fault pattern can to an extent be thought of as a "fingerprint" of the fault sources.

According to at least one form of embodiment, the fault pattern can be assigned to a known, characteristic fault pattern.

The known, characteristic fault pattern can, for example, be taken from a fault catalog, or can be generated through machine learning.

According to at least one form of embodiment, the method also contains the generation of a response signal depending on a theoretical input signal that is, in particular, time-discrete, and on the transfer parameters.

The response signal corresponds here to a theoretical measurement signal if the theoretical input signal were to be present at the location of the partial discharge.

According to at least one form of embodiment, the theoretical input signal is a pulse signal that approximates to a partial discharge pulse. The theoretical input signal can, for example, only differ from zero at one discrete time point. This corresponds to the usually very short rise time of a partial discharge pulse.

According to at least one form of embodiment, the generation of the response signal includes the determination of a transfer function from the transfer parameters and the application of the transfer function to the theoretical input signal.

"Application" is to be understood here in the sense of the application of a mathematical operator. The application of the transfer function to the theoretical input signal can, for example, take place in a z-domain. This means that a z-transformation of the theoretical input signal can be generated, and can be multiplied with the transfer function in a corresponding z-domain representation. The result can, optionally, be transformed back through an inverse z-transformation into the discrete time domain, in order to obtain the response signal in the discrete time domain. The calculation can, alternatively, take place in the discrete time domain or in the frequency domain.

According to at least one form of embodiment, the at least one characteristic variable of the partial discharge contains a value for an apparent charge of the partial discharge. The apparent charge is, in particular, an apparent charge at the location of the partial discharge.

According to at least one form of embodiment, the value for an apparent charge of the partial discharge is determined depending on the response signal.

According to at least one form of embodiment, the determination of the value for the apparent charge contains an integration of the response signal, or of a signal that depends on the response signal, in particular in the discrete time domain. The signal that depends on the response signal can, for example, be generated by filtering the response signal. The filtering can, for example, here correspond to bandpass filtering, in particular with a frequency band according to the international IEC 60270:2000 standard, whose content is hereby included herein through reference. The frequency band can, for example, lie within the range from 100 to 900 kHz, or, for example, correspond to 100 to 400 kHz.

Because the response signal is not subject to any significant noise or other interfering influences, a reliable value for the apparent charge at the location of the PD can be determined in spite of the signal attenuation. According to the improved concept, the apparent charge can thus be ascertained with greater accuracy, independently of the distance of the connection point from the location of the partial discharge.

The charge value obtained in this way can be placed in relationship with the theoretical input signal. From this it is possible to ascertain what proportion of the input signal can still be measured as an output signal. This makes it possible to determine the amount of energy released at the discharge location independently of the distance of the measuring point from the fault location. This is a significant advantage for assessing the state of electrical operating resources, since in this way the hazard presented by the fault location can thus be assessed.

The value for the apparent charge at the location of the PD can be determined in accordance with the improved concept both for homogeneously constructed operating resources and for inhomogeneously constructed operating resources.

According to at least one form of embodiment, the at least one characteristic variable of the partial discharge contains a fault location of the partial discharge. The fault location of the partial discharge is ascertained here depending on the response signal.

According to at least one form of embodiment, the ascertainment of the fault location of the partial discharge includes an adaptation of a reference function to the response signal, wherein the adaptation is made through an adaptation of at least one parameter of the reference function.

According to at least one form of embodiment, the adaptation takes place by making use of a numerical optimization algorithm, for example a Levenberg-Marquardt algorithm.

According to at least one form of embodiment, the reference function is a solution to a differential equation describing a resonant electrical circuit. The reason for this is that the partial discharge excites a resonant electrical circuit between the fault location of the partial discharge and the connection point.

According to at least one form of embodiment, the determination of the fault location takes place depending on a capacitance and/or an inductance of the operating resource, wherein the capacitance and/or the inductance in particular represents a respective approximate value.

According to at least one form of embodiment, the capacitance and/or the inductance are ascertained through the adaptation of the reference function to the response signal. In particular, the capacitance and/or the inductance are parameters of the reference function that are adapted.

According to at least one form of embodiment, the location of the partial discharge is determined from the at least one adapted parameter of the reference function and from the geometry of the operating resource.

The location of the partial discharge can be in particular determined for homogeneously constructed operating resources in accordance with the improved concept. Due to the fact that the response signal is not subject to any significant noise or other interfering influences, a very precise localization of the fault source can be achieved, independently of the distance of the connection point from the fault location, in spite of the signal attenuation. Tests permit an expectation of a precision of at least 5% in relation to a length of the operating resource.

For inhomogeneously constructed operating resources, at least the parameters of the reference function can be ascertained, in particular the capacitance and/or the inductance, whereby even without considering the geometry of the operating resource in detail, a qualitative assessment can be made, for example a relative position of different fault sources with respect to one another and in relation to the connection point can be ascertained.

According to the improved concept, a test apparatus for analyzing the state of an electrical operating resource is also disclosed. The test apparatus comprises an evaluation device that is designed to acquire a measurement signal at a connection point of the operating resource. The evaluation unit is furthermore designed, depending on the measurement signal, to ascertain transfer parameters that characterize a signal transmission from a location of a partial discharge in the operating resource to the connection point. The evaluation unit is furthermore designed to determine at least one characteristic variable of the partial discharge depending on the transfer parameters.

According to at least one form of embodiment of the test apparatus, it also contains a high-voltage source for applying a test voltage to the operating resource.

According to at least one form of embodiment, the test apparatus contains a coupling unit that can be coupled to the connection point and to the evaluation unit, in particular can be directly or indirectly electrically connected, and is designed to provide the measurement signal to the evaluation unit.

According to at least one form of embodiment, the coupling unit contains a measuring impedance, in particular an inductive element with adjustable inductance.

According to at least one form of embodiment, the coupling unit contains a filter element or filter network connected downstream of the inductive element. The filter element here has, for example, a high-pass or band-pass characteristic.

Possible cut-off frequencies for the high-pass filter can, for example, be 30 kHz or 100 kHz. For the bandpass filter in turn, 100 kHz as the lower cut-off frequency and/or 400 kHz or 500 kHz as the upper cut-off frequency are, for example, possible. Other cut-off frequencies are possible or necessary, according to the concrete requirements. For monitoring applications, band-pass characteristics can, for example, be required that call for an upper cut-off frequency of several megahertz up to several tens of megahertz.

According to at least one form of embodiment, the coupling unit is designed to convert a signal, in particular a current signal, as its input into the measurement signal, in particular a voltage signal at its signal output.

According to at least one form of embodiment, the test apparatus contains a coupling capacitor that can be connected between the coupling unit and the connecting point, in particular that can be directly or indirectly connected to the connecting point, and which can be or is electrically connected to the coupling unit. The coupling capacitor is, for example, a high-voltage capacitor. The coupling capacitor can, for example, provide for recharging a fault source or maintaining an electrical field at the fault location.

Further forms of embodiment and implementations of the test apparatus emerge directly from the various forms of embodiment of the method according to the improved concept, and vice versa. In particular, individual or multiple components described in connection with the test apparatus and/or arrangements for carrying out the method can be correspondingly implemented.

The invention is explained in detail below with reference to exemplary forms of embodiment and with reference to the drawings. Components that are identical or are functionally identical or that have an identical effect can be given identical reference signs. Identical components, or components with identical function, are in some cases only explained with reference to the figure in which they first appear. The explanation is not necessarily repeated in the subsequent figures.

FIG. 1 shows a schematic illustration of an exemplary form of embodiment of a test apparatus according to the improved concept, and an exemplary operating resource. The operating resource is illustrated by way of example as a screened cable with a screen SC and a core SE. The operating resource can, however, be an arbitrary, homogeneously or inhomogeneously constructed electrical operating resource with components that are electrically insulated from one another. The core SE and the screen SC are correspondingly to be replaced by the mutually electrically insulated components of the operating resource. In the case of a GIS or GIL, these would, for example, be one of the insulated cables and a pressure vessel of the GIS/GIL. In the case of transformers this would, for example, be a transformer winding and a tank of the transformer. Decoupling is, in principle, always possible, provided a suitable capacitance is present in order to recharge at least a part of the PD and thus to acquire it.

The test apparatus can comprise a high-voltage source HV, for example a high-voltage generator, that can be connected to a connection point AS of the operating resource, for example the core SE. The test apparatus can, moreover, comprise a coupling capacitor KK and a coupling unit KE, that are connected in series with one another. The coupling capacitor KK can, for example, be connected to the connection point AS. A high-voltage source HV and a coupling capacitor KK can, alternatively, be connected to different points on the operating resource, in particular the high-voltage source HV to an injection point of the operating resource, in particular the core SE, and the coupling capacitor KK to the connection point AS.

Alternatively the high-voltage source can also be a component such as a generator or a grid transformer that is in any case required for energy generation or distribution.

According to the improved concept, the test apparatus comprises an evaluation unit AE that is, for example, electrically connected to the coupling unit KE.

During a test, a test voltage provided by the high-voltage source HV can be injected into the operating resource at the connection point AS. A signal that is generated, for example, by a partial discharge in an insulation of the operating resource can thereupon be acquired by the coupling capacitor KK and the coupling unit KE, and output as a measurement signal to the evaluation unit AE.

Figure 3A:
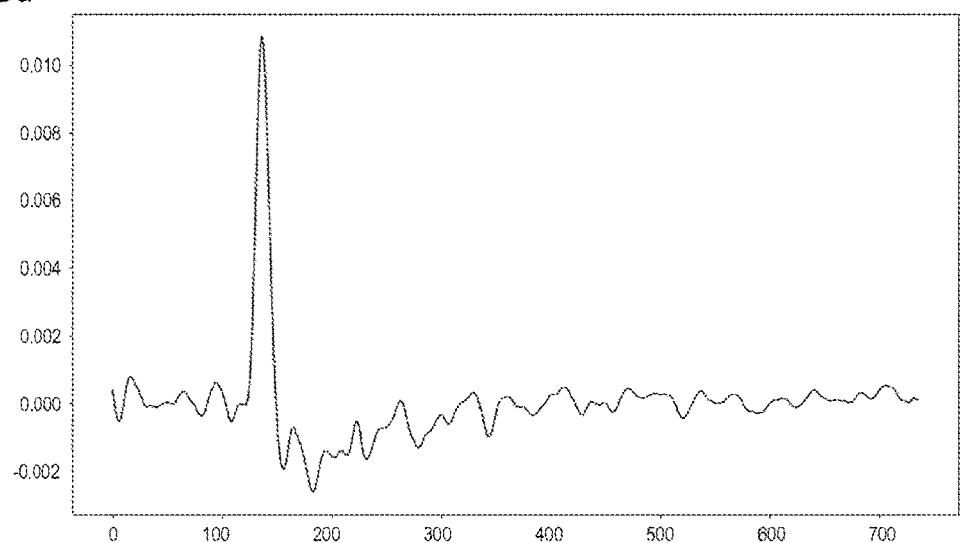
FIGS. 3a, 3b, 3c show illustrations of a measurement signal, a theoretical input signal and a response signal according to a further exemplary form of embodiment of a method according to the improved concept.

The evaluation unit AE can, for example, digitize the measurement signal and thereby generate a discrete measurement signal. An exemplary discrete measurement signal is shown in FIG. 3a.

On the basis of the measurement signal, in particular of the discrete measurement signal, the evaluation unit AE can then ascertain transfer parameters that characterize a signal transmission from a location of the partial discharge in the operating resource to the connection point AE, and can determine one or a plurality of characteristic variables of the partial discharge depending on the transfer parameters.

The transfer parameters can here be the predictors $a_i$ of a virtual filter defined by the recursion equation (1). The evaluation unit AE can therefore determine the transfer parameters by minimizing the total square error qE in accordance with equation (2).

The transfer parameters can be expressed as the parameters of a transfer function that connects a theoretical input signal to the discrete measurement signal through the partial discharge. The transfer parameters can, in particular, correspond to the locations of poles of the transfer function in the complex z-domain.

Figure 2A:
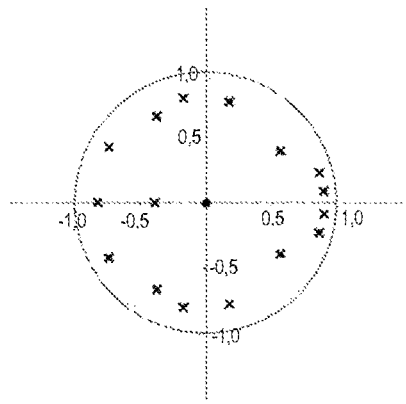
FIGS. 2a, 2b show illustrations of an exemplary transfer function according to an exemplary form of embodiment of a method according to the improved concept.

FIG. 2a shows a result of an exemplary determination of the transfer parameters. Each cross here represents the location of a pole of the associated transfer function.

Figure 2B:
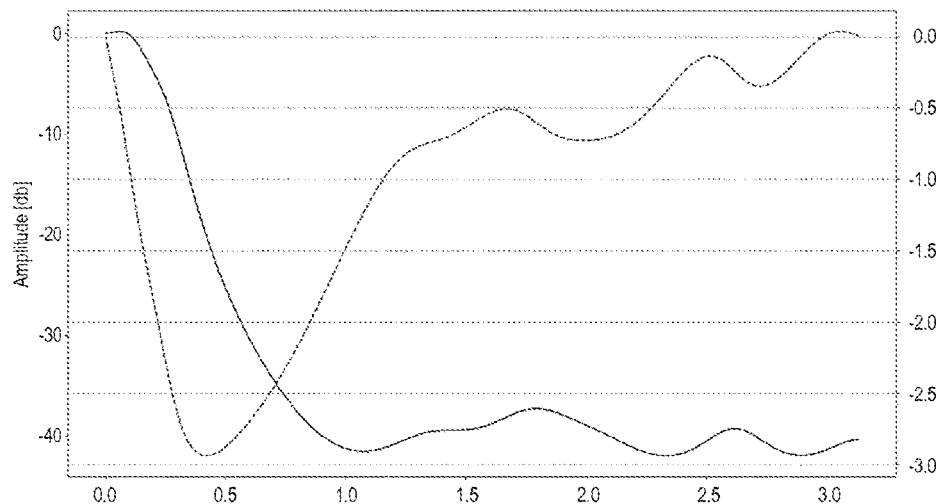

FIG. 2b shows an amplitude (continuous line) and a phase angle (dashed line) of the transfer function of FIG. 2a in the frequency domain. The transfer function can then be transformed from the z-domain through inverse z-transformation and Fourier transformation into the frequency domain.

On the basis of the transfer parameters and their distribution, in particular on the basis of the arrangement of the locations of the poles of the transfer function, a characterization of the fault source or fault sources that have caused the partial discharge or plurality of partial discharges can be performed directly. For example, on the basis of the transfer parameters, something that can be thought of as a fingerprint of the fault sources can be generated and this can, for example, be compared with known characteristic fault patterns. The number of fault sources and their relative contribution to the total partial discharge can, in particular, be determined in this way.

Figure 3B:
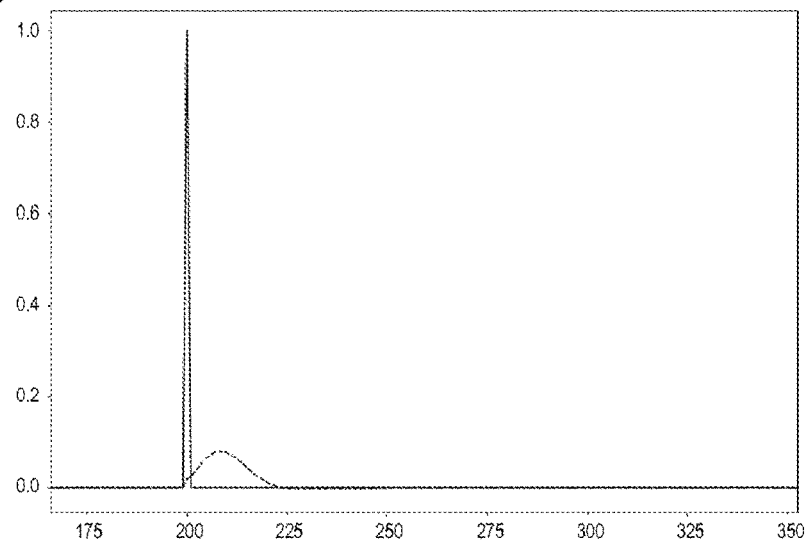

FIG. 3b shows a theoretical input signal, in particular one generated digitally (continuous line). Since a partial discharge pulse has a very fast rise time, for example in the region of a few nanoseconds or one nanosecond, the theoretical input signal can, for example, correspond to a digital pulse of minimal width. An area of the theoretical input signal is, for example, equal to 1.

Figure 3C:
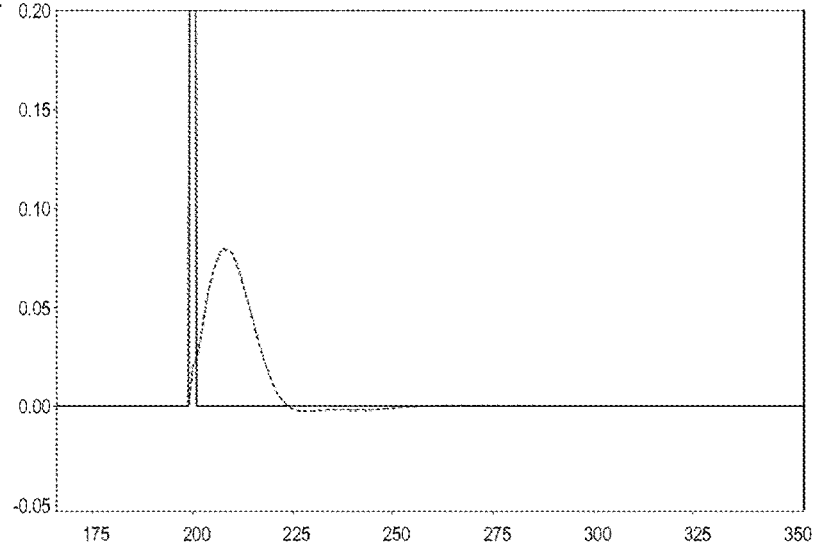

FIG. 3b also shows a response signal (dashed line) that corresponds to the mapping of the theoretical input signal by means of the transfer function. FIG. 3c shows a magnified detail from FIG. 3b.

The response signal is similar to the discrete measurement signal of FIG. 3a, but is, however, virtually free of noise. The evaluation unit AE can filter and integrate the response signal, for example in a specific range, for example as given in IEC 60270:2000, for example in the range from 100-400 kHz. The result of the integration is a measure for the apparent charging of the partial discharge at the location of the PD. In the example of FIGS. 3b and 3c the digital input signal has the area 1, and the integration of the filtered response signal yields, for example, 0.55. If this value is compared with a reference value that can be, for example, determined by feeding a defined charge with a PD calibrator, a value for the apparent charge can be determined.

A resonant circuit from the fault location to the connection point AS can be excited by the partial discharge. The differential equation:

$$LC \cdot \ddot{U} + RC \cdot \dot{U} + U = 0 \quad (3)$$

can for example be used to describe the resonance in general. U here is an electrical voltage, R is a resistance, L an inductance and C a capacitance in the resonant circuit. A differential equation for a corresponding electrical current has the same form, and can be used in an analogous manner.

Solutions to the equation (3) can then serve as reference functions, and in the event of resonance have the known form:

$$U(t) = U_0 \exp(-tR/2L) \cdot \sin(t/LC + \varphi) \text{ if } (R/2L)^2 < 1/LC. \quad (4)$$

Figure 4:
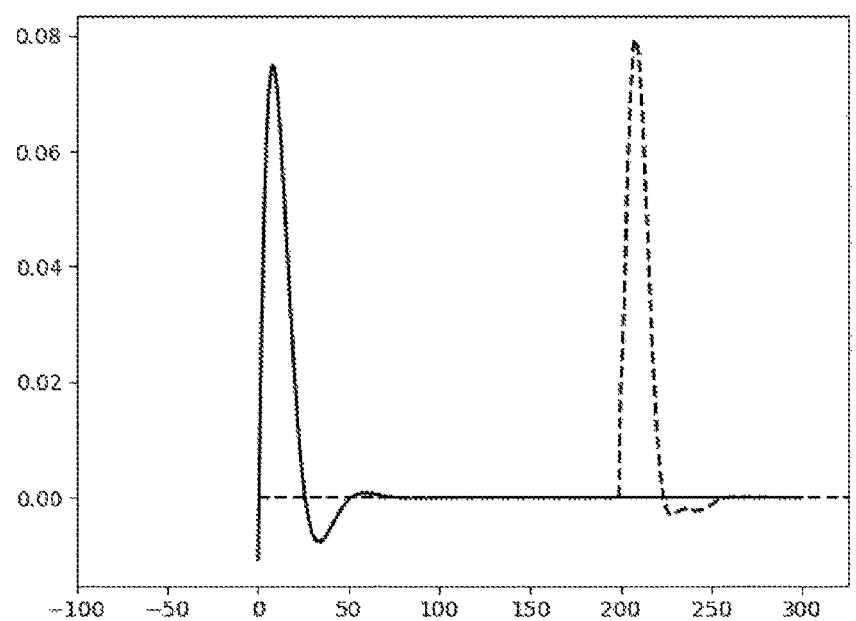
FIG. 4 shows illustrations of a reference function and a response signal according to a further exemplary form of embodiment of a method according to the improved concept.

$U_0$ and $\varphi$ here are parameters that depend on the initial conditions of the resonance. Corresponding solutions to equation (3) are known for the creep case and the aperiodic limit case. The capacitance C or the inductance L can in particular be determined from an adaptation or a fitting of the reference function to the response signal. FIG. 4 shows, by way of example, the response signal (dashed) and the reference function (continuous line). To make the illustration clearer, the two curves have been offset in time with respect to one another.

In the case of a homogeneously constructed operating resource, for example a cable, a GIS or GIL, a distance between the fault location and the connection point AS can be ascertained on the basis of the geometry of the operating resource, for example the length and cross-section of the cable, cross-section of the core and, in relevant cases, on the basis of the insulation material used. The fault location can thus be determined in this way.

In the case of an inhomogeneously constructed operating resource, a quantitative characterization of the fault source or of multiple fault sources can be made on the basis of inductance L and/or capacitance C. Relative distances between the fault locations of different fault sources and connection point AS can, for example, be determined or narrowed down.

A more accurate PD analysis of electrical operating resources is made possible with a method or a test apparatus according to the improved concept. The charge released at the fault location can be ascertained for all types of electrical operating resource, in particular for cables, and this enables a significant improvement in the assessment of the state. Only a single excitation, for example one PD pulse at the fault location, is needed for a method according to the improved concept. A resonant circuit of inductive, capacitive and resistive elements of the operating resource and the measurement circuit is thereby constructed. The current or the voltage in this circuit is fully described. The fault location can therefore also be determined, in particular in the case of cables, without signal reflection taking place at the fault location. Faults can therefore be recognized even at low partial discharge levels, i.e. at low released charges, and therefore in particular at an early stage. The improved concept also enables different partial discharge sources to be separated on the basis of the ascertained transfer parameters ("fingerprint").

The improved concept makes use of the recognition that the operating resource can be looked on as a filter, for example a low-pass filter. A method for LPC can therefore be used in order to ascertain the transfer parameters. The accuracy of the transfer parameters depends here in particular on the order of the approximation involved, as well as on the available data, for example on a sampling rate or a signal-to-noise ratio of the discrete measurement signal.

A method according to the improved concept can also be used for assessing the state of components of the electrical energy transmission system, for example in the sense of a permanent or continuous monitoring during the normal operation of the components.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS

HV High-voltage source
AE Evaluation unit
KK Coupling capacitor
KE Coupling unit
AS Connection point
SC Screen
SE Core

The invention claimed is:

1. A test apparatus for performing a partial discharge measurement of an electrical operating resource, the electrical operating resource comprising components that are electrically insulated from one another, the test apparatus comprising:
   a high-voltage source, the high-voltage source being configured to be connected to a connection point or an injection point of the electrical operating resource, and the high-voltage source being configured to provide a test voltage that is configured to be injected into the operating resource at the connection point or the injection point;
   a coupling capacitor configured to be connected to the connection point of the electrical operating resource;
   a coupling unit comprising a measuring impedance, the coupling unit being configured to be coupled to the electrical operating resource via the coupling capacitor, and being configured to convert a signal acquired by the coupling capacitor from the electrical operating resource into a measurement signal, the signal being generated at the electrical operating resource in response to the injected test voltage; and
   an evaluation device that is coupled to the coupling unit, the evaluation device being configured to:
   acquire the measurement signal from the coupling unit;
   based on the measurement signal, ascertain transfer parameters that characterize a signal transmission from a location of a partial discharge in the operating resource to the connection point; and
   determine at least one characteristic variable of the partial discharge based on the transfer parameters, wherein the ascertaining of the transfer parameters comprises processing the measurement signal using linear predictive coding.

2. The test apparatus of claim 1,
   wherein processing the measurement signal using linear predictive coding comprises ascertaining filter coefficients of a virtual filter,
   wherein the virtual filter is described by the following recursive equation:

$$y(k) = e(k) + \sum_{i=1}^{N} a_1 \cdot y(k-i)$$

wherein k is a discrete time point, y(k) is a discrete value of the measurement signal at the discrete time point k, N is an order of the approximation, y(k−i) is defined as equal to 0 if (k−i) is lower than or equal to zero, $a_k$ are linear predictors of the Nth order, and e(k) is a prediction error,
   wherein the transfer parameters correspond to the linear predictors,
   wherein ascertaining the transfer parameters comprises minimizing a total square error qE given by:

$$qE = \sum_{k=1}^{N^2} e(k) = \sum_{k=1}^{N} \left( y(k) - \sum_{i=1}^{N} a_1 \cdot y(k-i) \right)^2,$$

wherein the transfer parameters correspond to poles of the transfer function in a complex z-domain, and
   wherein determining at least one characteristic variable of the partial discharge based on the transfer parameters comprises evaluating locations of the poles of the transfer function.

3. The test apparatus as claimed in claim 1, wherein the ascertaining of the transfer parameters comprises ascertaining filter coefficients of a virtual filter, wherein the virtual filter is configured to simulate the signal transmission.

4. The test apparatus as claimed in claim 1, wherein the ascertaining of the transfer parameters comprises a discretization or digitization of the measurement signal.

5. The test apparatus as claimed in claim 1, wherein the at least one characteristic variable of the partial discharge comprises at least one characteristic variable of one or a plurality of fault sources from which the partial discharge results.

6. The test apparatus as claimed in claim 5, wherein the at least one characteristic variable of the one or the plurality of fault sources comprises a number of the fault sources or a relative contribution of one of the fault sources to the partial discharge.

7. The test apparatus as claimed in claim 1, wherein the at least one characteristic variable of the partial discharge comprises a value for an apparent charge of the partial discharge.

8. The test apparatus as claimed in claim 1, wherein the at least one characteristic variable of the partial discharge comprises a fault location of the partial discharge.

9. The test apparatus as claimed in claim 8, wherein the determination of the fault location is based upon a capacitance or an inductance of the operating resource.

10. A method for performing a partial discharge measurement of an electrical operating resource that comprises components that are electrically insulated from one another, the method performed using a test apparatus, the test apparatus comprising: a high-voltage source connected to a connection point or an injection point of the electrical operating resource, and the high-voltage source being configured to provide a test voltage; a coupling capacitor connected to the connection point of the electrical operating resource; a coupling unit comprising a measuring impedance, the coupling unit being coupled to the electrical operating resource via the coupling capacitor, and being configured to convert a signal acquired by the coupling capacitor from the electrical operating resource into a measurement signal, the method comprising:
    applying, using the high-voltage source, the test voltage to the electrical operating resource at the injection point;
    acquiring the measurement signal from the connection point of the electrical operating resource, the measurement signal resulting from the applied test voltage;

ascertaining transfer parameters of a transfer function that characterize a signal transmission from a location of a partial discharge in the electrical operating resource to the connection point by processing the measurement signal using linear predictive coding;

determining at least one characteristic variable of the partial discharge based on the transfer parameters;

identifying a fault pattern based on the at least one characteristic variable; and servicing, repairing, removing from service, or exchanging the electrical operating resource based on the identified fault pattern.

11. The method as claimed in claim 10, wherein the operating resource comprises:
a cable;
a gas-insulated switchgear;
a gas-insulated cable;
a power transformer;
a tap changer;
a power switch;
an isolator;
an isolating switch;
a measurement transducer;
a surge arrester; or
a component of a power transformer.

12. The method as claimed in claim 10, the method further comprising determining a number of fault sources and relative contributions of the fault sources by comparing the fault pattern to known characteristic fault patterns.

13. The method as claimed in claim 12, wherein the known characteristic fault patterns are obtained from a fault catalog or generated through machine learning.

\* \* \* \* \*